United States Patent
Byskov et al.

(10) Patent No.: US 7,083,082 B2
(45) Date of Patent: Aug. 1, 2006

(54) FEEDER VERIFICATION WITH A CAMERA

(75) Inventors: Kurt Byskov, Aarhus C (DK); Henning Maerkedahl, Hinnerup (DK)

(73) Assignee: Valor Denmark A/S, Aarhus C (DK)

(*) Notice: Subject to any disclaimer, the term of this patent is extended or adjusted under 35 U.S.C. 154(b) by 23 days.

(21) Appl. No.: 10/506,905

(22) PCT Filed: Mar. 6, 2003

(86) PCT No.: PCT/DK03/00134

§ 371 (c)(1),
(2), (4) Date: Sep. 7, 2004

(87) PCT Pub. No.: WO03/077628

PCT Pub. Date: Sep. 18, 2003

(65) Prior Publication Data

US 2005/0161498 A1 Jul. 28, 2005

(30) Foreign Application Priority Data

Mar. 8, 2002 (EP) ................................. 02005415

(51) Int. Cl.
*G06F 17/00* (2006.01)

(52) U.S. Cl. .................................................. 235/375

(58) Field of Classification Search ............... 235/375; 700/221, 224, 121; 382/103; 29/739, 700
See application file for complete search history.

(56) References Cited

U.S. PATENT DOCUMENTS

| | | | |
|---|---|---|---|
| 5,099,522 A | | 3/1992 | Morimoto |
| 5,667,129 A | | 9/1997 | Morita |
| 5,878,151 A | * | 3/1999 | Tang et al. ................. 382/103 |
| 6,027,019 A | * | 2/2000 | Kou ........................... 235/375 |
| 6,762,847 B1 | * | 7/2004 | Duquette et al. ........... 356/614 |
| 6,778,878 B1 | * | 8/2004 | Kou ........................... 700/221 |
| 2002/0053133 A1 | * | 5/2002 | Suhara et al. ................ 29/700 |
| 2002/0124391 A1 | * | 9/2002 | Kawai et al. ................ 29/739 |
| 2002/0143423 A1 | * | 10/2002 | Huber et al. ................ 700/121 |
| 2003/0219330 A1 | * | 11/2003 | Lyndaker et al. ........... 414/411 |
| 2004/0186616 A1 | * | 9/2004 | Overman et al. ........... 700/224 |

FOREIGN PATENT DOCUMENTS

| | | |
|---|---|---|
| JP | 3-270833 A | 12/1991 |
| JP | 2000-22392 A | 1/2000 |
| WO | WO 00/19794 A1 | 4/2000 |

* cited by examiner

*Primary Examiner*—Thien M. Le
*Assistant Examiner*—Thien T. Mai
(74) *Attorney, Agent, or Firm*—David S. Safran

(57) ABSTRACT

A method for component verification during operation of a component placement machine (101) has a series of feeder slots (103) for holding component feeders (104) with feeder markers. Each feeder marker carries a unique feeder ID, and each feeder slot (103) has a unique slot ID (208). On an image taken with a camera of the feeder slots, image analysis is performed to check whether the actual feeders in the slots correspond to those feeders that are intended to be placed in these slots.

15 Claims, 3 Drawing Sheets

FEEDER VERIFICATION WITH A CAMERA

FIELD OF THE INVENTION

The present invention relates to the monitoring of the configuration of component feeders on a component placement machine, for example for electronic components.

BACKGROUND OF THE INVENTION

For electronic board assembly, automated component placement can reach very high speed up to tens of thousands of surface mounts of components per hour. These components are typically supplied by component vendors as taped reels of components which are loaded onto individual feeders which then are mounted in corresponding feeder slots on the machine. These reels of components may be loaded onto the feeders at a special loading unit, for example in a stock room, after which the loaded feeders are placed in the feeder slots.

Component placement machines can have more than 100 feeder slots each accessible by a picking mechanism that picks individual components from the feeders in the slots and places them in particular predetermined locations on a printed circuit board. For application flexibility, each feeder and slot is generally constructed to be compatible with many different components.

The physical arrangement of components, feeders and slots must be in accordance with the expected arrangement as programmed in the machine. Any error in the arrangement can cause a corresponding error in the placement of components on the board. In a high volume, low mix manufacturing environment, a component loading error can produce a high number of defective printed circuit boards in a short period of time. In a low volume, high mix environment the chance of component loading error increases because of frequent feeder manipulation for product change over.

In order to eliminate loading errors, it is known to place bar code labels on individual feeders and slots for manual scanning to control that the right components indeed are placed in the right slots according to a so called device list, which contains a listing of the slots and the components that are expected in the different slots. This procedure is carried out, before the machine begins its operation.

Often, component placement machines are not born with sufficient control mechanisms to assure the feeding of correct components as desired by the user of these types of machines. Different solutions have been suggested where additional equipment is provided from a producer different than the producer of the machine and post-mounted on the machine. For such post-mounting, certain conditions in connection with the machines, as the mechanical structure, have to be taken into account. Often, the task is not to find the optimum solution generally, but to find the optimum solution under the given circumstances, that is to say to find the optimum solution for a given mechanical structure of the component placement machine. For example, some component placement machines have feeders on a platform or table that moves with respect to the pick-up system while others have a stationary table and a moving pick-up system. The control solutions are typically different for these two different types of machines.

A machine with an integrated control system is disclosed in Japanese patent application JP 2000 0223923 by Akira Tsunoda. This system is designed for a feeder system produced by Yamaha Motor Co Ltd, where a camera is mounted on the pick-up device and images the feeder identification close to the position where components are picked up. The system is used after installation of the feeders and before start of the industrial process for fabrication of the product. For use, the pick-up mechanism moves along the feeder table and images one feeder ID after the other, until all feeder IDs have been scanned. If a mistake is observed by the system, an alarm is sent to the operator for correction of the set-up. If the set-up is corrected, the system is used again for the control until the control reveals a correct installation of the feeders. This system has a number disadvantages. Firstly, this system is only suited for machines with sufficient space for mounting of a camera on the moving pick-up mechanism. Secondly, the feeder ID has to be placed relatively precisely in the vicinity of the pick-up region in order that the camera can image the ID. For a system integrated in a special machine, this is adaptable; however, several existing feeder machines do not have space at the pick-up region for mount of an ID. Therefore, this system is not suited for post-mounting. Thirdly, this system utilizes the machine information of the slot positions. As the machine is born with the control system, this utilizing is possible; however, such position information is usually not available for post-mounted systems. Fourthly, the procedure is performed before the start of the machine and in case of determined mistakes repeated before the start of the machine. Thereby, expensive time is wasted before the production start. Fifthly, if a number of feeders are placed wrongly in the machine, the time used for replacement of the feeder and a successive scan is multiplied. This can be understood from the following: a first error will be detected for the first wrongly placed feeder, after which a replacement has to be performed and a new scan has to be performed revealing the next wrongly placed feeder. This adds up to a long time before the machine is ready for operation. It would be desirable to provide a system not having these disadvantages.

A post-mounted control system has been disclosed in U.S. Pat. No. 6,027,019. In this system, two scanners are adapted to monitor the arrangement of slot markers and feeder markers in the machine while the machine is in operation. The slot marker and feeder marker are then compared with data in a device list. Such a control system is only suitable for existing machines, where the table is moveable while the pick up is stationary, because in many existing machines with movable pick-up systems, not enough space is left on the pick up for mounting a scanner on the pick-up. This system as described in U.S. Pat. No. 6,027,019 has another disadvantage in not being able to detect feeders with wrong components before the machine is started. An eventual error is first detected, after the first component has been picked up. If a component is wrong, expensive time is wasted until the machine is stopped and rearranged. A third disadvantage has also been observed for this system. As the table is moved, problems with reading of the feeder ID may occur in situations where a component from a special feeder is picked up from one edge of the feeder such that the feeder position is different than if the component would be picked up from the centre of the feeder.

For machines with stationary feeder platforms, a system is known, where each feeder is equipped with a transponder that is connected with the feeder by a chain. The transponder is inserted in a corresponding array platform behind the feeder for manual check whether the feeder is in the right slot. However, also this system has a drawback in not being able to prevent a misplacement of the transponder. The latter is due to the fact that feeders may be rather slim with the result of a hardly discernible correct position of two adjacent feeder positions in the platform.

For existing machines, no control solution has hitherto been proposed for taking into account the situation of the so-called splicing when a feeder only has a few components left on a tape. During splicing, the empty reel is taken out of the feeder without removing the remaining few components on the tape in the feeder. The tape with the remaining few components is then fastened—spliced—to a new tape with components rolled on a new reel, which then is inserted into the feeder. The advantage is that reels can be exchanged without having to exchange the feeder or stop the operation of the machine. However, no system has hitherto been provided to control whether a tape with correct components has been spliced to the tape with the remaining few components.

SUMMARY OF THE INVENTION

It is the purpose of the invention to provide a cheap, fast and reliable system suitable for post-mounting and a method for monitoring the configuration of component feeders on a component placement machine, where the system and method are independent of whether the machine has a movable platform or a moveable pick-up. Advantageously, the invention shall also be extendable to take into account the situation of splicing.

This purpose is achieved by a method for component verification in connection with operation of a component placement machine having a series of feeder slots for holding component feeders with feeder markers, each feeder marker carrying a unique feeder ID, wherein each feeder slot has a unique slot ID, wherein the method comprises determining the actual feeder IDs carried by the actually installed feeders in the series of feeder slots and using this information in comparison with stored configuration information to check for configuration errors, in addition to providing at least one camera for providing an image spanning over the series of feeder slots, providing the image and performing image analysis on the image for determining the actual feeder IDs carried by the actually installed feeders in the series of feeder slots. In order to provide image analysis, different kinds of image analysis systems for digital images exist commercially.

The method according to the invention has a number of advantages. It may be implemented on existing placement machines, which is an important criterion. A camera, for example with a CCD (charge coupled device) detector, may be installed stationary at an appropriate location with optics that images all feeder slots with a suitable resolution. A mount of a camera on the pick-up head is thereby avoided. Alternatively, especially if a large number of feeders are used, a number of cameras may be provided, where each camera images a series of feeders and where, finally, an image for analysis is produced as a combined image from the images from this number of cameras. Such image addition is known according to prior art in different application fields. By imaging all feeders simultaneously and analyzing the image, all configuration errors may be detected and indicated to the operator in one turn, which is a great advantage as compared with those machines, where a successive scanning of the feeders is performed as explained in connection with the aforementioned Japanese system by Tsunoda.

The equipment necessary for post-mounting a system according to the invention, where the method according to the invention may be implemented, is cheap and implies mainly one or several low cost cameras, some cabling, a programmed computer and an image analysis program. Therefore, such a system is highly attractive. Another advantage is the fact that the method according to the invention is applicable for several types of machines. It may be applied with machines, where the feeder slots are mounted on a stationary platform and where the components are picked-up by a moving pick-up. It may also be applied for machines, where the pick-up is stationary and where the platform with the feeder slots is displaceable.

With the method according to the invention, manual checking procedures are avoided, reducing mistakes by operators and therefore reduces machine stopping during operation.

The method steps may be used before the machine starts operating already during the mount of feeders into the slots. Thus, once all feeders are installed, the check has already been finished and the placement machine may start operation immediately. In contrast to the method as disclosed in the aforementioned Japanese patent application JP 2000 0223923 by Akira Tsunoda, no time consuming scanning with movable hardware components is required after the installation of the feeders. According to the invention, a single image may be processed revealing within short time, whether mistakes have been made during the mounting process.

The saved time as compared to the Japanese system by Tsunoda can be estimated to the range of 10–30 seconds for each scan, which does not seem much at first sight. However, it has to be stressed that this amount of time is saved each time a wrong feeders is detected, and each time a feeder is changed, for example, when a feeder runs empty, or when failures are observed during operation or when the machine is stopped for other reasons. This implies that, in total, a substantial amount of time is gained by the invention in comparison to the Tsunoda system and other known systems. Especially, for articles where earnings are low, for example telephones, a high production speed is essential and a saving of time of only a few percent becomes crucial.

In order to assure a fast check and a high safety, the steps in the method according to the invention may be repeated continuously before start of operation of the machine, for example during mount of the feeders, such that the system may indicate acceptance of all feeders as soon as the feeders are installed and operation may start immediately. Thus, the time used for check is optimized in this way. Furthermore, it may be repeated continuously during operation of the machine in order to provide additional safety.

The intended feeder ID refers to the expected feeder to be found in the actual slot according to stored configuration information, while the actual feeder ID refers to the feeder which actually is in the actual slot. These two IDs are compared, and in case of discrepancy between the intended feeder ID and the actual feeder ID, the discrepancy may be indicated, for example by an alert to the operator of the machine, or stored and evaluated by other means.

Whilst the feeder ID is actually indicated on the feeder and used for reading, the slot ID need not be indicated on the slot itself. However, the slot ID is unique and stored in a database as an address for component pick-up from the corresponding slot. Such slot ID may comprise or be linked to a relative position of the feeder.

Preferably, the stored configuration information comprises a first list, a Feeder/Component List, associating each intended feeder ID with a component ID indicative of the type of component to be contained in the corresponding feeder, and a second list, Device List, associating feeder slots IDs (208) with component IDs. These data lists are normally available, as these lists are used in the programmed operation of the machine.

As many different types of feeders exist, even for the same machine type, it might be difficult to place the feeder identifier exactly on the same position on every feeder. Most likely the feeder identifier will be placed in different positions on different feeder types. This is taken into account in a further embodiment, wherein the method further comprises the following steps in connection with mount of a component reel in a feeder; imaging the feeder ID of the feeder with a further camera, calculating data indicative for the position of the feeder ID relative to a reference point related to the feeder, and storing in a database the data for use as configuration information. Thus, the invention does allow some offset on the feeder identifier position on the feeder. According to the invention, this is taken into account by registration of the offset in a so-called kitting station, into which the feeder is placed and where the feeder ID and the position of the feeder ID are read with the camera. Then, the offset is calculated in two dimensions as the position of the feeder identifier compared to a fixed reference point. The offset for the feeder ID is then saved in the database for later use as configuration information which may be used for calibration. Therefore, the demands of the invention are by far less stringent than existing systems, which makes the method and system according to the invention much more flexible.

The different feeder slots are in most known systems positioned with equal distances. However, for the method and system according to the invention, this is not necessary as the invention in a further embodiment foresees a calibration procedure of the slot positions. This calibration provides a series of position coordinates which afterwards may be associated to a slot ID of a feeder slot in the series of feeder slots.

Such a calibration has a further advantage. Even though the slot positions on a feeder station may be distributed with exactly the same distance between every position, this may appear not to be the case on the image taken by the camera. Depending on the type of camera lens, the image may be distorted so that the slot distance in the edge of the image seems to be larger than in the centre of the image. Therefore, the system is advantageously calibrated with position data describing the coordinate of every slot position in the camera image.

A calibration of this kind may be performed by using a special calibration feeder mounted with a feeder identifier containing a special feeder ID that can be recognized by the system. The calibration feeder is then placed slot by slot in all slot positions on the feeder station, and for every position, the system is instructed about the slot number, for example via a keyboard. The system can then save the calibration data containing position coordinates for each slot position.

A further development of this calibration method consists of having a special calibration feeder with two or maybe more—feeder IDs. These feeder IDs are placed with a distance that is exactly the same as the distance between slot positions on the feeder station. Then two slot positions can be calibrated every time the feeder is placed in a slot during the calibration procedure, and thus the calibration procedure is fast.

An even further development of the calibration method is to place the calibration feeder with two (or more) feeder identifiers only in a slot in the centre of the camera image and in a slot at the edge of the camera image. Then by measuring the distance between slots in the centre of the image and at the edge of the image, the calibration data for the remaining slots within the camera image can be approximated by assuming that the slot distance changes linearly or parabolic from the centre to the edge of the image.

An alternative calibration method is the following; if the slot distance between adjacent slots in the series of feeder slots is assumed to be constant. In this case the calibration for associating position coordinates to the slot ID of each feeder slot comprises determining for each particular feeder slot the number of slots from the first slot to the particular feeder slot, and adding to the position coordinate of the first slot coordinates equivalent to the distance from the first slot to the particular feeder slot, where this distance is calculated as the slot distance between adjacent slots times the number of slots from the first slot to the particular feeder slot. This is a very simple procedure which is safe and fast.

For this method, it is of advantage, if the calibration for associating position coordinates to the slot ID of each feeder slot comprises the provision of a position mark with a certain fixed distance to the series of feeder slots, such that imaging the position mark together with the series of feeder slots may be used for calculating the position coordinates in relation to the position mark. The value of this step may be recognized by the following. The platform may be of the movable type, where the rest position or start position of the platform is not well defined or sufficient accurate. In these cases, it is of advantage that the image analysis program may recognize a position mark by which the coordinates of the slots with feeders may easily be calculated. Advantages of a position mark may also be apparent, if the camera during operation is exposed to dust, such that the image analysis program may not function properly any more and the first slot is not determinable with certainty. Equal difficulty may also arise in case that the camera has been moved accidentally.

In case that the series of feeder slots are mounted on a displaceable platform with a predetermined, sufficiently well-defined rest position or predetermined start position, the calibration for associating position coordinates to the slot ID may be performed using an image taken in the rest position or start position of the platform.

Such a calibration is advantageously used together with a further step, where an actual position coordinate is assigned to each of the actual feeder IDs in order to associate each actual feeder ID to a respective slot ID.

In a certain embodiment of the invention, the check for configuration errors comprises determining from stored configuration information the intended feeder IDs of those feeders that are intended to be installed in respective slots in the series of feeder slots and checking by comparing the actual feeder IDs with the intended feeder IDs in the respective slots, whether the actually installed feeders in the feeder slots correspond to the intended feeders, and if this is not the case, indicating this discrepancy. This embodiment may be illustrated in more detail by the following practical approach.

In connection with the image of the series of feeder slots, a series of position coordinates is provided, where each position coordinate is associated to a slot ID of a feeder slot in this series of feeder slots. These position coordinates may be given for all slots or only for those slots where feeders are installed and used for the component pick-up. By performing image analysis of the obtained image, the actual feeder IDs of the actually installed feeders in the series of feeder slots are determined and an actual position coordinate is assigned to each of these actual feeder IDs. Such an actual position coordinate is taken from the series of position coordinates. From stored configuration information, typically the Device List and the Feeder/Component List, the intended feeder IDs are determined of those feeders that are intended to be installed in the series of feeder slots. Furthermore, for each of those intended feeders, an intended position coordinate is determined, which also is taken from the series of position coordinates.

Then, for each intended position coordinate, it is checked whether an actual feeder ID is assigned to the position, and if this is not the case, this is indicated, for example by an alarm message to the operator of the machine. If on the other hand this is the case, it is checked whether the intended feeder ID and the actual feeder ID for this position coordinate are equal, and if this is not the case, this discrepancy is indicated, for example by an alert to the operator.

In this practical approach, the intermediate step has been assumed that the method further comprises determining for each of those intended feeders an intended position coordinate, the intended position coordinate taken from the series of position coordinates, and checking for each intended position coordinate, whether an actual feeder ID is assigned to the position, and indicating if this is not the case.

Instead of comparing the intended ID of the intended feeders in the series of slots with the imaged actual feeder ID's, as described in the foregoing, an alternative embodiment may be used, where intended components are compared to actual components. This embodiment is in principle equivalent to the foregoing though in practice slightly different. This alternative embodiment comprises for each actual feeder, determining from stored configuration information a first component ID for the type of components actually contained in the actual feeder, where the stored configuration information comprises a first list associating each intended feeder ID with a component ID indicative of the type of component to be contained in the corresponding feeder, for each slot defined to contain a feeder, determining from stored configuration information the second component ID for the component that is supposed to be contained in a feeder in the slot, where the stored configuration information comprises a second list associating feeder slots with component IDs, and checking whether the first and the second component ID are equal, and if this is not the case, indicating this discrepancy.

Measuring distances and assigning coordinates to the slots and feeders can be used for a further improvement of the invention. In this case, the feeder type may be identified, for example by measuring the width of the feeder. This feature further reduces the risk for faults.

The following embodiment of the invention takes into account the situation of splicing in certain placement machines. Splicing is performed manually, which due to human error may result in final products having defects because wrong component reels have been spliced and packed into the feeder. In order to trace the wrong components from the wrong spliced reel, the invention foresees the following further embodiment. The splicing may be performed by incorporating a label, for example a colored or patterned band behind the components at the splicing region of the component reel in a feeder. The label is then recognized by the image analysis system and the date and time for the use of components from a spliced reel may be stored in a database. If a defect product is found at a later stage and the quality control reveals a wrong component, the stored date and time data help finding other defect products.

In fact, the image system with the camera and the image analysis program may be configured with such a resolution and precision that the components to be picked-up from the feeders may be recognized by the image analysis system for determination whether the components from a feeder in a feeder slot correspond to components intended to be taken from that feeder. In this case, a splicing of reels with wrong components may be recognized early and the production of defect products prevented.

In order to generally assure that the camera works properly, for example to assure that the CCD chip or the objective have not been subject to damage or that the cabling or image processing program work properly, an image control is preferably performed automatically for determining the performance of the camera. For example such a control may be performed routinely before every production process when the machine is stopped. Such a control may advantageously be combined with the aforementioned position mark.

The pitch of the reel in a feeder is adjustable. For example, the distance of the components to be picked-up from the reel in the feeder may be 4 mm. If the pitch in the feeder is 8 mm, only every second component is picked-up from the reel. Such a mistake is hard to recognize by the operator, because the production process itself works correctly, just every second component is wasted. The method according to the invention with the image system is taking account for this problem in a further embodiment, where the obtained image is analyzed for recognition of the correct reel pitch. In case that the recognized reel pitch is not in accordance with stored configuration information, an alert is given to the operator.

Furthermore, the image analysis program may as well be configured to recognize defect feeders installed in feeder slots.

BRIEF DESCRIPTION OF THE DRAWINGS

The invention will be explained in more detail with reference to the drawing, where.

DESCRIPTION OF PREFERRED EMBODIMENT

Figure 1:
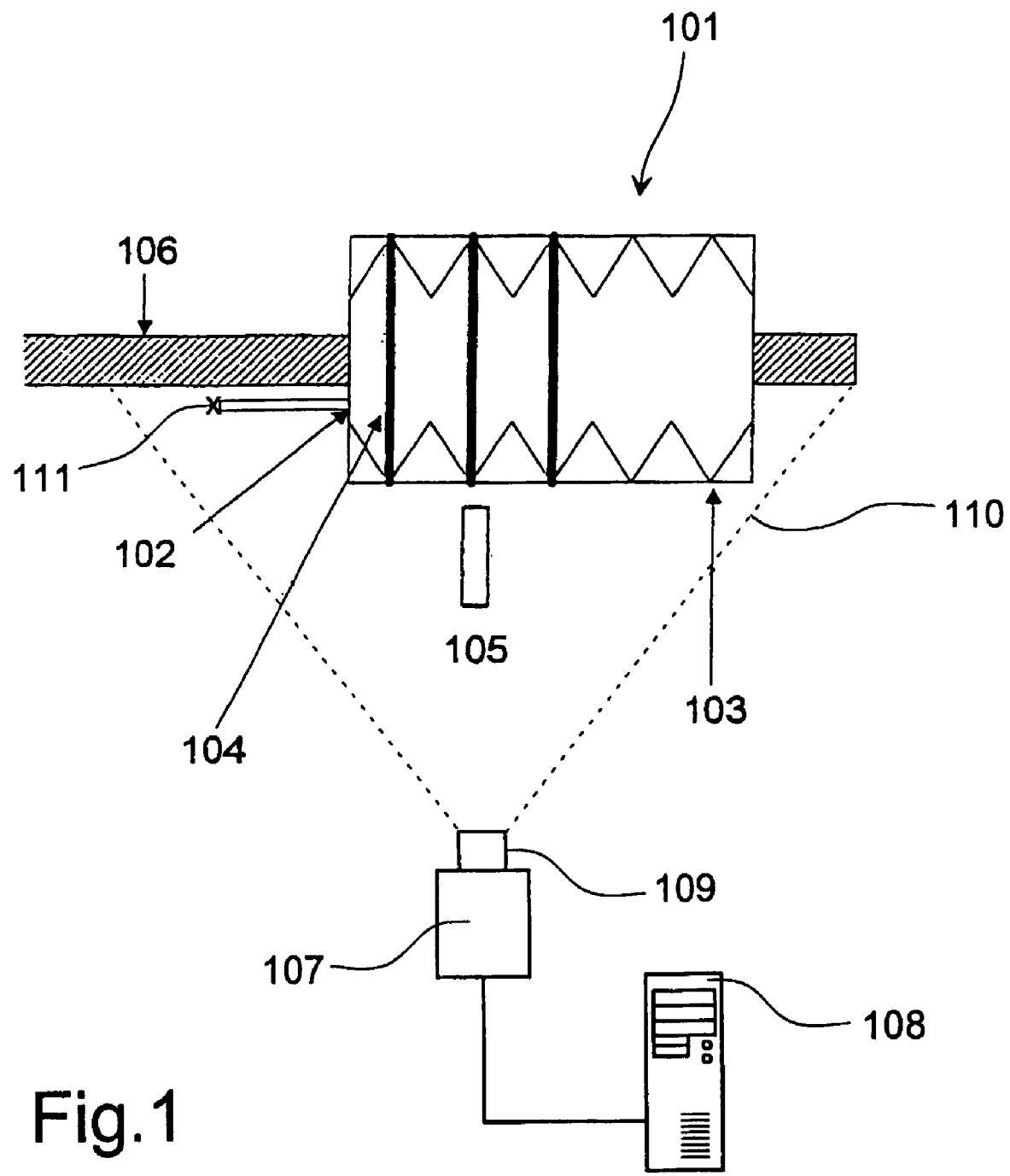
FIG. 1 shows the principle of a placement machine post-equipped with a camera.

In FIG. 1, a placement machine 101 is illustrated having a platform 102, on which a number of slots 103 are located. Into each slot 103, a feeder 104 may be placed. Certain feeder 104 types may extend into several slots 103. The platform 102 is displaced relatively to the component pick up arm 105 for picking up components from different slots 103. Alternatively, the pick up arm 105 may be displaced with respect to the platform 102.

Each feeder 104 is provided with an identification marker, feeder ID, for example a bar code label that is designed to be readable by an appropriate scanner. According to the invention, the feeder ID is imaged by a camera 107 and analyzed in a computer 108 by an image analysis computer program. By using a camera 107 according to the invention, the feeder marker may be different from a bar-code and may contain additional information about the feeder, and eventually information about the contained type of components.

The camera 107 images the series of slots 103 with feeders on the platform 102. The camera 107 may be equipped with an objective 109 with a view 110 that covers the complete platform 102. Alternatively, to cover a long platform 102, a number of cameras 107 may be used to take images which then are combined by appropriate computer routines in the computer 108.

For stationary platforms 102, the camera 107 may be mounted at a fixed position. For moving platforms, the camera may move along with the platform 102. Alternatively, the camera 107 and the image analysis program may be programmed only to evaluate images, when the platform 102 is in a special position, for example the start position. For additional precision and convenience, a position mark 111 may be provided with a fixed distance to the slots 103, for example by a mark 111 rigidly connected to the platform 102. In the latter case, the platform 102 needs not to have a certain position for the imaging, as the position mark 111 may have the role for coordinate calibration for the slots 103. Alternatively, the mark 111 may be positioned independently of the platform 102. In case of a moving platform 102, the distance is not fixed but nevertheless well defined when the platform 102 is in the rest or start position.

Figure 2:
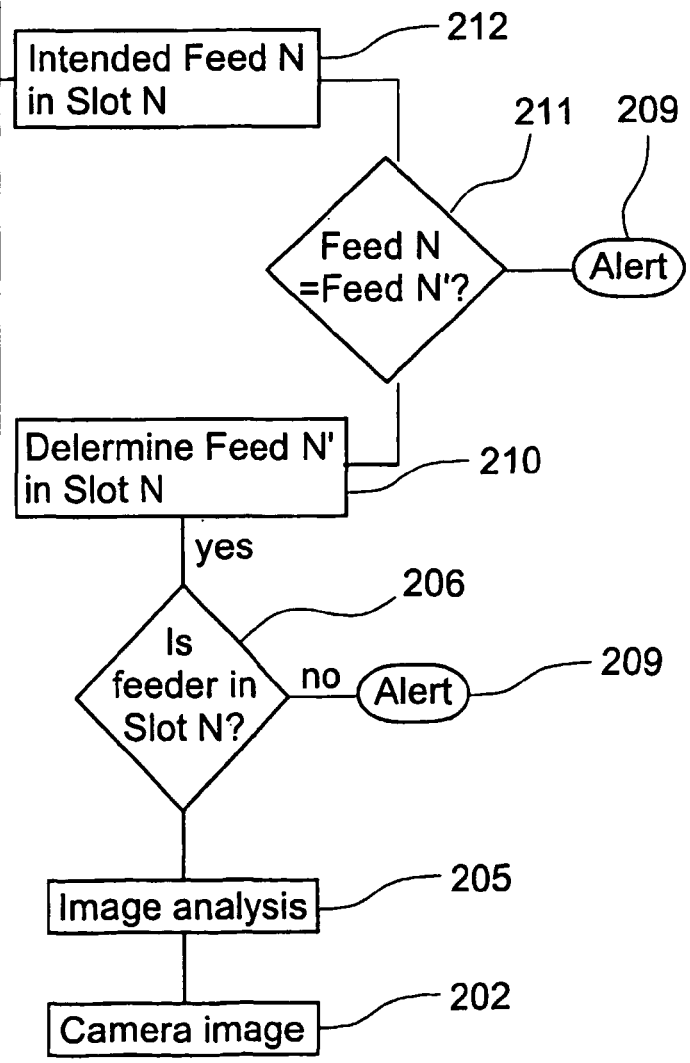
FIG. 2 illustrates the method according to the invention.

Normally, when component reels are loaded into a feeder 104, this is done in a so-called kitting station where the feeder marker is read and the feeder ID 203 is stored in a first list together with the first component ID 204' of the component reel in the feeder 104. The computer 108 is configured to have access to these data in a list, which is illustrated in FIG. 2 as a Feeder/Component List 201. From other stored configuration information, which is a second list shown as a Device List 207, a second component ID 204 of the type of component expected in a slot with slot ID 208 may be found. Combining the data from these two lists 201, 207, the intended feeder with intended feeder ID 203—Feed N—in a certain feeder slot 208 may be found 212. Not all slots 103 may contain a feeder 104, as not all slots 103 may have to be used in a production process. Link of the feeders from the Feeder/Component List to the slots in the Device List is made through the measured positions of the slots during calibration and the positions assigned to the feeders by image analysis 205 performed on the images taken by the camera.

In the computer program performing the method according to the invention, the intended feeder ID 203 in each feeder containing slot is checked against the actual feeder ID that has been read by the camera for each particular slot. For this, the camera 107 images 202 the platform 102, where each slot ID 208 is provided with position coordinates achieved by calibration. This is preferably done for all slots 103, such that a series of position coordinates is obtained for the whole series of slots, but it may, alternatively, only be done for those slots that are intended to contain feeders 103. The first slot is found automatically by the image analysis 205, for example by using the position mark 111, and a coordinate is assigned to this first slot. In case that the distance between adjacent slots is constant for all slots 103, the distance to the following slots can easily be found by multiplication or addition and corresponding coordinates can be applied. If the distance between slots 103 is not constant, the image analysis program can be programmed to find the slots 103 automatically and then assign appropriate position coordinates to the slots as determined from the image.

From the lists 201, 207 as described above, those slots 103 that contain feeders 104 are evaluated further in that it is checked 206 whether a feeder 104 is contained in theses slots 103 at all. If this is not the case, an alert 209 is given to the operator. From the obtained image, the actual feeder marker is read and the actual feeder ID—Feed N'—determined 210. In a next step, the intended feeder ID—Feed N—and the actual feeder ID—Feed N'—are compared 211 and in case of non-compliance, an alert 209 is given to the operator.

Figure 3:
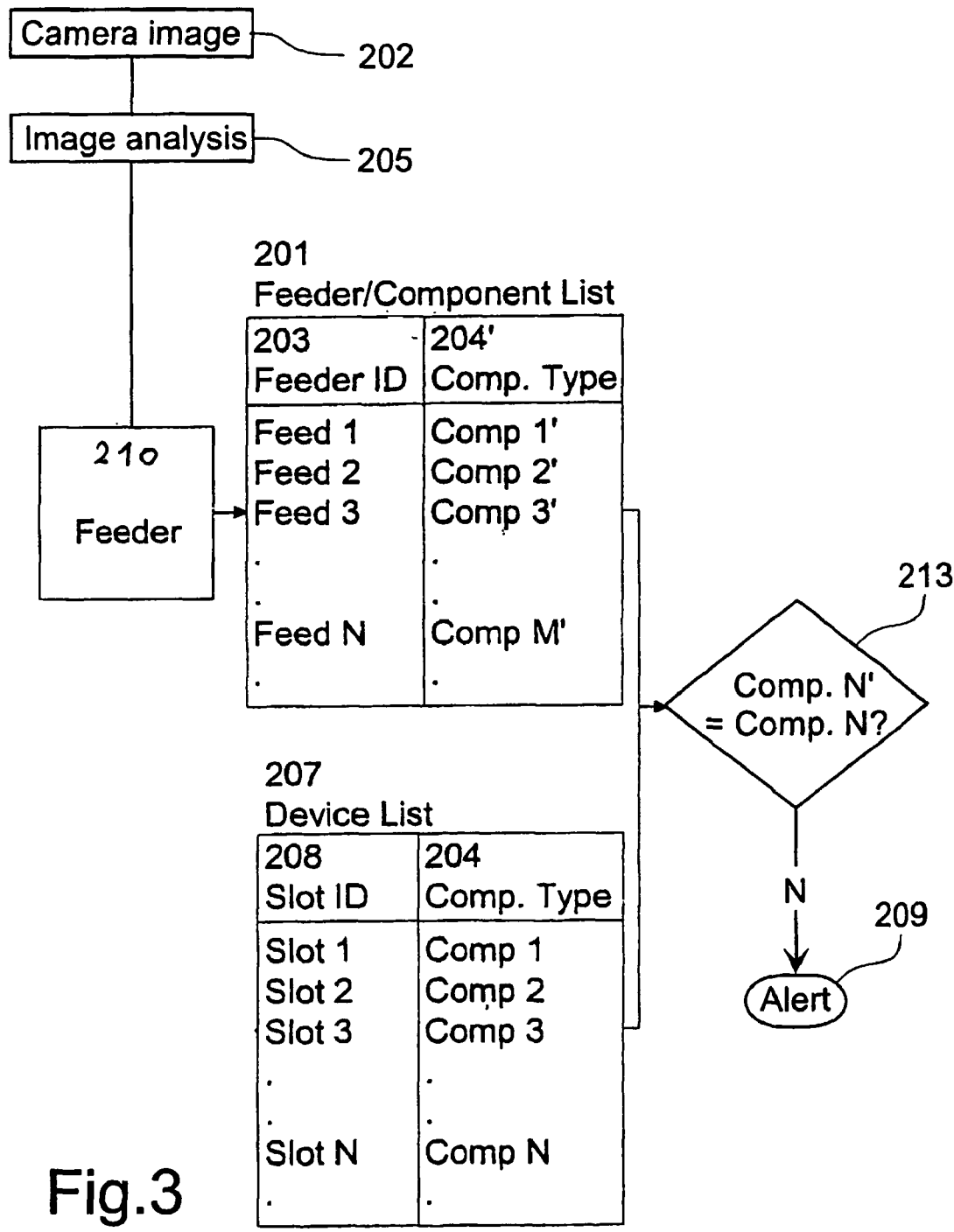
FIG. 3 illustrates an alternative embodiment.

Instead of comparing 211 the intended ID 203 of the intended feeders in the series of slots 208 with the imaged actual feeder IDs 210, an alternative embodiment may be used, which is in principle equivalent though in practice slightly different. In FIG. 3, this alternative approach is illustrated. From the obtained image 202 which is analyzed 205 in order to assign positions to the feeder IDs 203 for relating theses to the calibrated positions of the slots 208, the actual feeders 104 in the slots 103 are determined 210. In this embodiment, the first component ID 204' for the type of components contained in the actual feeder 203 is determined from the Feeder/Component List 201. For each slot 208 defined to contain a feeder, the second component ID 204 for the component that is supposed to be contained in the slot 204 is determined from the device list 207. As a final step, it is checked whether the first and the second component ID are equal, and if this is not the case, this discrepancy is indicated 209.

The alert 209 to the operator may alternatively be coupled to an automatic stopping routine of the machine such that the control and the action after a recognized fault may prevent any placement of components. The method according to the invention may be implemented to only function before the placement machine starts operating. It may also be implemented such that the method is performed steadily during the operation of the placement machine in order to achieve maximum security.

The invention claimed is:

1. Method for component verification in connection with operation of a component placement machine (101) having a series of feeder slots (103) for holding component feeders (104) with feeder markers, each feeder marker carrying a unique feeder ID, wherein each feeder slot (103) has a unique slot ID (208), the method comprising determining (210) the actual feeder IDs carried by the actually installed feeders (104) in said series of feeder slots (103) and using this information in comparison with stored configuration information (201, 207) to check for configuration errors, characterized in that the method comprises providing at least one camera (107) for providing an image (202) spanning over said series of feeder slots (103) and in the image imaging all feeder IDs of the feeders in the feeder series of feeder slots simultaneously, providing said image and performing image analysis (205) on it for determining (210) the actual feeder IDs carried by the actually installed feeders (104) in said series of feeder slots (103).

2. Method according to claim 1, wherein said method steps are repeated continuously before start of operation of said machine, during operation of said machine, or both before start of operation and during operation of said machine.

3. Method according to claim 1, wherein said stored configuration information comprises a first list (201) associating each intended feeder ID with a component ID (204') indicative of the type of component to be contained in the corresponding feeder (203), and a second list (207) associating feeder slots IDs (208) with component IDs (204).

4. Method according to claim 1, further comprising, in connection with mount of a component reel in a feeder, imaging the feeder ID of said feeder with a further camera, calculating data indicative for the position of said feeder ID relative to a reference point related to said feeder, and storing in a database said data for use as configuration information.

5. Method according to claim 1, further comprising for the image analysis providing by calibration a series of position coordinates, where each position coordinate is associated to a slot ID (208) of a feeder slot (103) in said series of feeder slots, assigning an actual position coordinate to each of these actual feeder IDs and associating each actual feeder ID to a respective slot ID.

6. Method according to claim 5, wherein the slot distance between adjacent slots (103) in said series of feeder slots is constant and wherein said calibration for associating position coordinates to the slot ID (208) of each feeder slot (103) comprises determining for each particular feeder slot (103) the number of slots from the first slot to the particular feeder slot, adding to the position coordinate of the first slot coordinates equivalent to the distance from the first slot to the particular feeder slot, where this distance is calculated as the slot distance between adjacent slots times the number of slots from the first slot to the particular feeder slot.

7. Method according to claim 5, wherein said calibration for associating position coordinates to the slot ID (208) of each feeder slot (103) comprises providing a position mark (111) with a certain fixed distance to said series of feeder slots, imaging said position mark together with said series of feeder slots, and calculating the position coordinates in relation to said position mark.

8. Method according to claim 6, wherein said series of feeder slots are mounted on a displaceable platform (102) with a predetermined rest position or predetermined start position, wherein said calibration for associating position coordinates to the slot ID is performed using an image taken in the rest position or start position of said platform (102).

9. Method according to claim 1, wherein said check for configuration errors comprises determining (212) from stored configuration information (201, 207) the intended feeder IDs (203) of those feeders (104) that are intended to be installed in respective slots in said series of feeder slots (103), wherein the stored configuration information associates each intended feeder ID with one slot ID (212), checking by comparing (211) the actual feeder IDs with the intended feeder IDs (203) in the respective slots, whether the actually installed feeders in the feeder slots correspond to the intended feeders, and if this is not the case, indicating (209) this discrepancy.

10. Method according to claim 9, further comprising determining for each of those intended feeders an intended position coordinate, said intended position coordinate taken from said series of position coordinates, checking (206) for each intended position coordinate, whether an actual feeder ID is assigned to said position, and indicating (209) if this is not the case.

11. Method according to claim 1, further comprising for each actual feeder, determining from stored configuration information (201) a first component ID (204') for the type of components actually contained in said actual feeder, where said stored configuration information comprises a first list (201) associating each intended feeder ID with a component ID (204') indicative of the type of component to be contained in the corresponding feeder (203), for each slot (208) defined to contain a feeder, determining from stored configuration information (207) the second component ID (204) for the component that is supposed to be contained in a feeder (104) in said slot (103), where said stored configuration information comprises a second list (207) associating feeder slots with component IDs, checking (213) whether the first (204') and the second component ID (204) are equal, and if this is not the case, indicating (209) this discrepancy.

12. Method according to claim 1, wherein the placement machine (101) is of the type where splicing is applicable, wherein the method further comprises image recognition of a label at the splicing region of the component reel in a feeder (104) and storing the data and time for the use of components from a spliced reel.

13. Method according to claim 1, wherein the obtained image is analyzed for recognition of components from a feeder and for determination, whether the components from a feeder in a feeder slot corresponds to components intended to be taken from that feeder.

14. Method according to claim 1, wherein the obtained image is analyzed for recognition of the reel pitch.

15. System for a method according to claim 1, wherein the system comprises a component placement machine (101) having a series of feeder slots (103) for holding component feeders (104) with feeder markers, each feeder marker carrying a unique feeder ID, wherein each feeder slot (103) has a unique slot ID (208), characterized in that the system also comprises at least one digital camera (107) for providing a digital image (202) spanning over said series of feeder slots (103), the camera being configured to image all feeder ID's of the feeders in the series of feeder slots simultaneously, an image analysis system functionally connected to said camera and being configured to perform image analysis (205) on said image for determining (210) the actual feeder IDs carried by the actually installed feeders (114) in said series of feeder slots (103), and a computer functionally connected to said image analysis system and configured to use the information determined by said image analysis system in comparison with stored configuration information (201, 207) to check for configuration errors.

* * * * *